(12) United States Patent
Lindseth et al.

(10) Patent No.: US 11,892,433 B2
(45) Date of Patent: Feb. 6, 2024

(54) ELECTROSPRAY CURRENT MEASUREMENT IN THE NANOSPRAY AND MICROSPRAY REGIME

(71) Applicant: Thermo Finnigan LLC, San Jose, CA (US)

(72) Inventors: Dale Lindseth, Rice, MN (US); Joshua A. Silveira, Gilroy, CA (US); Michael L. Poltash, Fremont, CA (US); Eloy R. Wouters, San Jose, CA (US); David E. Minkler, Campbell, CA (US)

(73) Assignee: Thermo Finnigan LLC, San Jose, CA (US)

( * ) Notice: Subject to any disclaimer, the term of this patent is extended or adjusted under 35 U.S.C. 154(b) by 173 days.

(21) Appl. No.: 17/391,880

(22) Filed: Aug. 2, 2021

(65) Prior Publication Data

US 2023/0030920 A1 Feb. 2, 2023

(51) Int. Cl.
| | |
|---|---|
| *H01J 49/16* | (2006.01) |
| *G01N 30/72* | (2006.01) |
| *G01N 30/02* | (2006.01) |

(52) U.S. Cl.
CPC ........ *G01N 30/7266* (2013.01); *H01J 49/165* (2013.01); *G01N 2030/027* (2013.01)

(58) Field of Classification Search
CPC .......... G01N 30/7266; G01N 2030/027; H01J 49/165; G01R 19/0061
See application file for complete search history.

(56) References Cited

U.S. PATENT DOCUMENTS

| | | | | |
|---|---|---|---|---|
| 3,987,390 | A * | 10/1976 | Kirklen | G01R 27/02 324/700 |
| 4,939,633 | A * | 7/1990 | Rhodes | H02M 7/48 363/41 |
| 4,994,165 | A | 2/1991 | Lee et al. | |
| 5,015,845 | A * | 5/1991 | Allen | G01N 30/7293 250/281 |
| 5,389,889 | A * | 2/1995 | Towne | G01R 33/07 330/6 |
| 5,541,490 | A * | 7/1996 | Sengupta | H01M 10/4257 320/160 |

(Continued)

OTHER PUBLICATIONS

Marginean L., et al., "Selection of the Optimum Electrospray Voltage for Gradient Elution LC-MS Measurements," Journal of the American Society for Mass Spectrometry, Apr. 1, 2009, vol. 20, No. 4, XP026010779, pp. 682-688 (Year: 2009).*

(Continued)

*Primary Examiner* — David J Bolduc (57) ABSTRACT

An electrospray ionization system used in mass spectrometry provides for improved current measurement. The system includes a fluid union, a fluid column coupled with a first port of the fluid union, a power source coupled with the fluid union and configured to apply a voltage potential to the fluid union, and an electrospray emitter coupled with a second port of the fluid union. The power source is coupled with the first port and configured to apply the voltage potential to the first port to restrict current leakage from the fluid union. The current sensing circuit is configured to determine an electrical current flow between the power source and the at least one of the fluid union and the first port.

20 Claims, 6 Drawing Sheets

(56) References Cited

U.S. PATENT DOCUMENTS

| | | | | |
|---|---|---|---|---|
| 6,452,166 B1* | 9/2002 | Enke | .................. | H01J 49/165 250/288 |
| 6,617,838 B1* | 9/2003 | Miranda | .................. | H03F 3/005 327/451 |
| 7,015,728 B1* | 3/2006 | Solic | .................. | H03F 3/45085 327/54 |
| 7,839,142 B2* | 11/2010 | Cech | .................. | B60R 21/0136 324/228 |
| 7,839,143 B2* | 11/2010 | Cech | .................. | B60R 21/0136 324/228 |
| 9,120,107 B1* | 9/2015 | Sauter, Jr. | .................. | B01L 3/0268 |
| 9,196,468 B2 | 11/2015 | Campbell et al. | | |
| 9,299,553 B2 | 3/2016 | Whitehouse et al. | | |
| 9,459,240 B2* | 10/2016 | Vorm | .................. | H01J 49/165 |
| 9,500,621 B2 | 11/2016 | Kotowski et al. | | |
| 9,939,471 B1* | 4/2018 | Omoumi | .................. | G01R 21/06 |
| 10,514,360 B1* | 12/2019 | Gentalen | .................. | H01J 49/147 |
| 10,591,450 B2 | 3/2020 | Maeda | | |
| 11,029,291 B2 | 6/2021 | Schultz et al. | | |
| 2002/0113207 A1* | 8/2002 | Lee | .................. | H01J 49/165 250/288 |
| 2005/0258360 A1* | 11/2005 | Whitehouse | .................. | H01J 49/165 250/288 |
| 2006/0176074 A1* | 8/2006 | Van Epps | .................. | G01R 1/06766 326/30 |
| 2008/0038152 A1* | 2/2008 | Van Pelt | .................. | G01N 30/7266 285/356 |
| 2008/0047330 A1* | 2/2008 | Whitehouse | .................. | H01J 49/165 73/61.53 |
| 2009/0152371 A1* | 6/2009 | Stark | .................. | H01J 49/165 239/3 |
| 2009/0219009 A1* | 9/2009 | Jansen | .................. | G01R 15/183 324/127 |
| 2011/0304339 A1* | 12/2011 | Schumacher | .................. | G01R 31/52 324/509 |
| 2012/0153143 A1* | 6/2012 | Kennedy | .................. | H01J 49/165 250/288 |
| 2013/0113507 A1* | 5/2013 | Danesh | .................. | G01R 21/133 324/713 |
| 2013/0319862 A1* | 12/2013 | Kotowski | .................. | G01N 27/44704 204/603 |
| 2014/0305801 A1* | 10/2014 | Peterson | .................. | G01N 27/44743 204/604 |
| 2015/0002136 A1* | 1/2015 | McTigue | .................. | G01R 1/06788 324/123 R |
| 2015/0198571 A1* | 7/2015 | Vorm | .................. | H01J 49/165 73/61.55 |
| 2015/0276812 A1* | 10/2015 | Ferguson | .................. | G01R 19/0092 324/123 R |
| 2016/0003787 A1 | 1/2016 | Wright et al. | | |
| 2016/0154029 A1* | 6/2016 | Danesh | .................. | G01R 17/02 324/76.11 |
| 2016/0217994 A1* | 7/2016 | Oleschuk | .................. | H01J 49/165 |
| 2017/0254837 A1* | 9/2017 | Boden | .................. | G01R 15/14 |
| 2017/0322188 A1* | 11/2017 | Dasgupta | .................. | G01N 30/34 |
| 2018/0158662 A1* | 6/2018 | Mellors | .................. | H01J 49/167 |
| 2018/0321302 A1* | 11/2018 | Qu | .................. | G01R 31/2829 |
| 2021/0063361 A1* | 3/2021 | Quint | .................. | G01N 30/8658 |
| 2021/0159061 A1 | 5/2021 | Silveira et al. | | |
| 2021/0210325 A1* | 7/2021 | Mellors | .................. | G01N 27/44791 |
| 2023/0010104 A1* | 1/2023 | Gentalen | .................. | G01N 30/8631 |

OTHER PUBLICATIONS

Bruins A.P., "Mechanistic Aspects of Electrospray Ionization," Journal of Chromatography A, Jan. 23, 1998, vol. 794, No. 1-2, XP004115405, pp. 345-357.

EP22188097.4, Extended European Search Report, dated Jan. 5, 2023, 13 pages.

Marginean I., et al., "Selection of the Optimum Electrospray Voltage for Gradient Elution LC-MS Measurements," Journal of the American Society for Mass Spectrometry, Apr. 1, 2009, vol. 20, No. 4, XP026010779, pp. 682-688.

Zhao X., et al., "Identification of Nitrate Ester Explosives by Liquid Chromatography-Electrospray Ionization and Atmospheric Pressure Chemical Ionization Mass Spectrometry," Journal of Chromatography A, Nov. 15, 2002, vol. 977, No. 1, XP004390894, pp. 59-68.

Manisali I., et al., "Electrospray Ionization Source Geometry for Mass Spectrometry: Past, Present, and Future," Trends in Analytical Chemistry, 2006, vol. 25, No. 3, pp. 243-256.

Valaskovic G.A., et al., "Automated Orthogonal Control System for Electrospray Ionization," Journal of the American Society for Mass Spectrometry, 2004, vol. 15, pp. 1201-1215.

* cited by examiner

ELECTROSPRAY CURRENT MEASUREMENT IN THE NANOSPRAY AND MICROSPRAY REGIME

TECHNICAL FIELD

The present disclosure is directed to the field of mass spectrometry, and more particularly to an electrospray ionization system and method used in mass spectrometry that provides for improved current measurement in the nanospray and microspray regime.

BACKGROUND OF THE INVENTION

Electrospray ionization (ESI) is a technique used in mass spectrometry (MS). More specifically, ESI is a "soft" ionization technique extensively used for production of gas phase ions while avoiding fragmentation. In a typical ESI process, a high voltage is applied to a liquid to create charged droplets which desolvate to form gas phase ions. Low flow electrospray, or "NanoESI," produces charged droplets from an emitter having a relatively small inner diameter (e.g., approximately 20 micrometers or less). The combination of low flow rate and small diameter results in increased ionization efficiency (i.e., the ratio of analyte molecules in solution to gas phase ions produced) and a reduction in the amount of sample required.

NanoESI plumes typically carry between 50 to 500 nanoamps of current. As such, because nanoESI results in greater sensitivity and produces relatively small ion currents, measuring these small ion currents often requires 10 nanoamps or better of measurement resolution as it is highly desirable to measure this spray current to a high degree of accuracy.

BRIEF SUMMARY OF THE INVENTION

The systems and methods disclosed can provide improved current measurement in the nanospray and microspray regimes of electrospray ionization.

In accordance with the concepts described herein, an apparatus for electrospray ionization of a fluid sample can include a fluid union, a fluid column coupled with a first port of the fluid union, a power source coupled with the fluid union and configured to apply a voltage potential to the fluid union sufficient to ionize the fluid sample to form an ionized fluid sample, and an electrospray emitter coupled with a second port of the fluid union. The fluid column may be packed with a stationary phase to utilize the setup to practice liquid chromatography. The fluid column can be configured to transfer a fluid sample into the fluid union via the first port. The power source can be coupled with the first port and configured to apply the voltage potential to the first port to restrict current leakage from the fluid union. The electrospray emitter can be further configured to emit the ionized fluid sample. In some versions, a current sensing circuit can be disposed between the power source and at least one of the fluid union and the first port, and the current sensing circuit can be configured to determine an electrical current flow between the power source and the at least one of the fluid union and the first port. In some aspects, the current sensing circuit can include a current sensing resistor.

In another aspect, a fluid reservoir can be coupled with a third port of the fluid union. The fluid reservoir can be operable to transfer a post-column additive fluid into the fluid union via the third port.

In another aspect, the power source can be coupled with the third port and configured to apply the voltage potential to the third port to restrict current leakage from the third port toward the fluid reservoir.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Embodiments of systems and methods for improved current measurement in the nanospray and microspray regimes of electrospray ionization.

The section headings used herein are for organizational purposes only and are not to be construed as limiting the described subject matter in any way.

In this detailed description of the various embodiments, for purposes of explanation, numerous specific details are set forth to provide a thorough understanding of the embodiments disclosed. One skilled in the art will appreciate, however, that these various embodiments may be practiced with or without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the various embodiments disclosed herein.

All literature and similar materials cited in this application, including but not limited to, patents, patent applications, articles, books, treatises, and internet web pages are expressly incorporated by reference in their entirety for any purpose. Unless described otherwise, all technical and scientific terms used herein have a meaning as is commonly understood by one of ordinary skill in the art to which the various embodiments described herein belongs.

It will be appreciated that there is an implied "about" prior to the temperatures, concentrations, times, pressures, flow rates, cross-sectional areas, etc. discussed in the present teachings, such that slight and insubstantial deviations are within the scope of the present teachings. In this application, the use of the singular includes the plural unless specifically stated otherwise. Also, the use of "comprise", "comprises", "comprising", "contain", "contains", "containing", "include", "includes", and "including" are not intended to be limiting. It is to be understood that both the foregoing general description and the following detailed description are exemplary and explanatory only and are not restrictive of the present teachings.

As used herein, "a" or "an" also may refer to "at least one" or "one or more." Also, the use of "or" is inclusive, such that the phrase "A or B" is true when "A" is true, "B" is true, or both "A" and "B" are true. Further, unless otherwise required by context, singular terms shall include pluralities and plural terms shall include the singular.

A "system" sets forth a set of components, real or abstract, comprising a whole where each component interacts with or is related to at least one other component within the whole.

A. Introduction

Described herein is a novel solution for directly measuring ESI spray current to nanoamps resolution in the presence of approximately +/−8 kilovolts or less of common mode voltage. In addition, the apparatus is capable of isolating the spray current (i.e., the current that is carried by charged droplets) from stray, bias, and other spurious current paths that can often prevent accurate and precise measurements. The inherent difficulties associated with these measurements are described, along with the novel approaches taken to overcome these challenges. Configuring a high side current sensing circuit to measure electrospray current is a novel and cost-effective way to achieve the desired precision and accuracy.

Further, generating accurate current-to-voltage curves are important for characterizing, diagnosing, and optimizing the electrospray apparatus. Such curves assist with differentiating between various electrospray regimes that principally govern the sensitivity of the instrumentation.

Still further, the solutions described herein can be used in a nano-micro flow ionization source as a diagnostic tool to assess cartridge health. The benefit of a power source being configured according to descriptions herein is that the improved fidelity of the current measurement readback could also serve to gather similar information as commonly obtained from an optical inspection apparatus of the ESI plume while the analysis of the circuit's readback is more amenable to automation in software.

Figure 1:
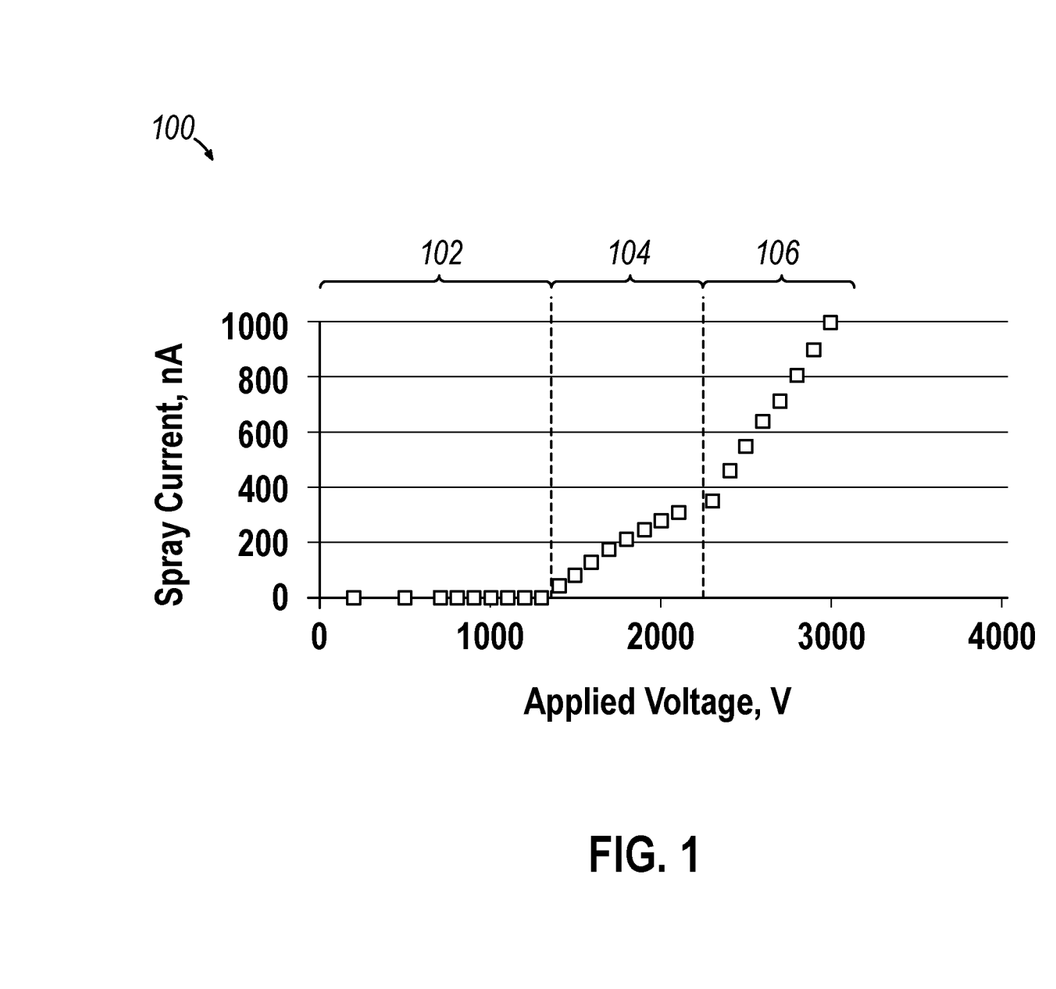
FIG. 1 depicts a graphical diagram displaying electrospray current regimes as a function of applied voltage to the electrospray emitter.

FIG. 1 depicts a graphical representation (100) of electrospray current as a function of applied voltage to the ESI. The voltage versus current curve illustrates the utility of spray current measurements. Curve 100 shows three distinct spray regimes, though additional regimes and characterizations can occur. The first regime (102) shows that a voltage below a certain threshold results in no spray or some fluid dripping (e.g., 0-1,200 volts). The second regime (104) shows an applied voltage that results in electrospray being present within the stable spindle regime where charged droplets are formed directly from a filament that extends from the Taylor Cone (e.g., 1,200-2,200 volts). In the third regime (106) the higher applied voltage results in the most commonly desirable cone jet where truncation of the filament is aided by coulombic repulsion thereby creating a diffuse plume of charged droplets (e.g., 2,200 volts). These three regions (102, 104, 106) are characterized by an abrupt increase in slope, where 1/slope represents the effective impedance for the given parameters such as flow rate, tip diameter, fluid composition, etc. This knowledge is important at least for setup, spray optimization, and diagnostics. Thus, it is possible to improve or optimize the spray without complex imaging algorithms or associated techniques.

FIG. 1 further illustrates one example of the importance of knowing both magnitude of the spray current and the applied voltage. The real challenge, however, is not so much the applied voltage, but rather, determination of the spray current itself. These challenges will become evident in the following discussion. It should be understood that the example depicted in FIG. 1 is valid for a fixed solvent composition, while in liquid chromatography-mass spectrometry (LC-MS) systems a gradient elution is used such that the composition varies with time.

Although FIG. 1 demonstrates that voltage vs. current curves can unambiguously differentiate between various electrospray regimes, a direct measure of ESI spray current is plagued with difficulty. Off the shelf power supplies, while most often outfitted with current and voltage monitor outputs, will only report the total load current. In reality, there are unknown leakage or spurious paths for current flow created by the conductive fluid streams themselves. To extract an accurate measure of ESI current, these components must be either ignored or subtracted from the whole. This requires a separate independent measure of spray current which is not typically available by the high voltage supply manufacturer. Any other loads, whether intentional or unintentional, must also be accounted for.

A direct measure of spray current can be obtained by a "high side" measurement technique, wherein the desired component of the load can be directed through a dedicated sense resistor committed to that end. One difficulty with this approach is that extremely small currents (e.g., requiring greater than 10 nanoamps of precision) must be measured in the presence of an extremely high common mode voltage. For the case of a +/−8 kilovolt power supply, the measurement circuit typically requires a minimum common mode rejection on the order of 100 decibels or more. Additionally, tolerance matching of high voltage and high ohm resistors must often be achieved to better than 0.01% accuracy. Novel techniques to this end will be described below.

B. High-Side Current Sensing without Isolation

A high-side current-sensing technique is one optimal approach for directly measuring spray current. The difficulty of the high-side current sensing approach is the ability to isolate the desired spray current from the inherent leakage, or "sneak" current paths, that are often present. The difficulty with this measurement is translating the high common mode down to the realm of normal data acquisition and computer electronics, while maintaining the required resolution and simultaneously, preventing damage to the downstream electronics.

Figure 2:
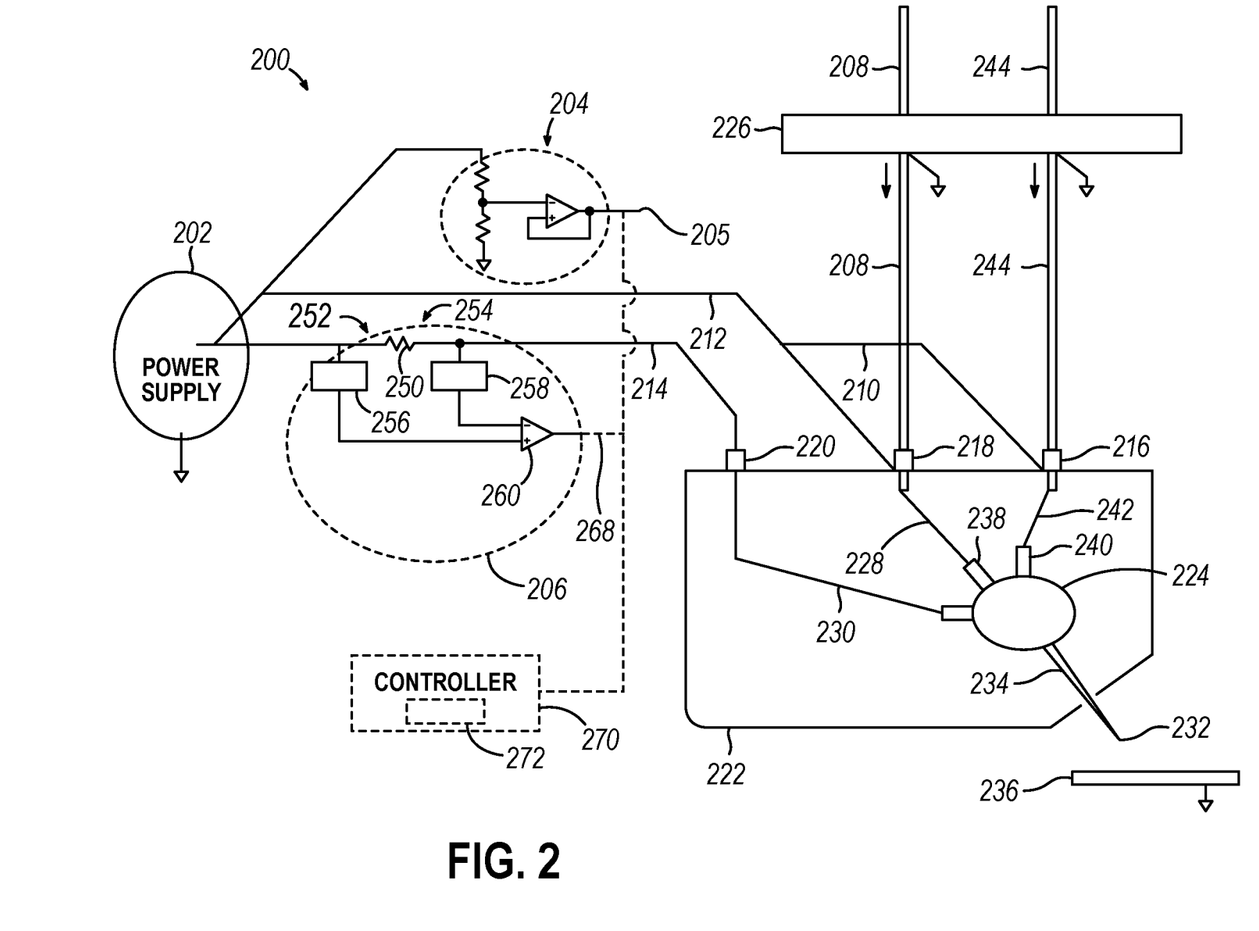
FIG. 2 depicts a schematic diagram of a first apparatus for electrospray ionization of a fluid sample, including a high-side current measurement circuit for directly measuring electrospray current without utilizing an isolation amplifier.

FIG. 2 depicts a first exemplary apparatus (200) for measurement of the spray current during the electrospray ionization of a fluidic sample. Apparatus (200) includes a high voltage power supply (202), a voltage monitoring circuit (204), and a current monitoring circuit (206). High voltage power supply (202) is configured to provide, for example, +/−8 kilovolts of power output. High voltage power supply (202) is coupled via electrical leads (210, 212, 214) to each liquid junction (216, 218, 220, respectively) (which may be, for example, needle caps), or input ports, to nanoESI cartridge (222). NanoESI cartridge (222) houses a fluidic union, such as multi-port fluid union (224), that is configured to receive one or more fluidic samples through fluid ports (238, 240). Particularly, multi-port fluid union (224) is configured to receive a sample ESI fluid at fluid port (238) via a first fluid connector (228) after it is eluted from an ESI fluid column (208). ESI fluid column (208) may be configured for, for example, liquid chromatography (LC) to separate molecules in a liquid mobile phase. In some configurations, ESI fluid column (208) is coupled with an electrically grounded bulkhead (226) to prevent stray electrical currents from traveling up the ESI fluid column (208). It should be understood that "electrically grounded" as used herein may also include electrical potentials operated at or near electrical grounds, or substantial electrical grounds. For example, in some instances, the electrical grounds may be biased up to +/−150 volts, which when compared to the approximately +/−8 kilovolts or less of common mode voltage described herein, represents a substantially grounded source.

It may be desirable in LC-MS procedures to add certain chemicals to the mobile phase or introduce them post-column prior to the interface to influence analyte ionization in order to improve the analyte signal. However, some additives may be used to suppress unwanted signals or selectively enhance the signal of particular compounds in a mixture. As such, in some configurations, multi-port fluid union (224) may also be configured to receive a second fluid at fluid port (240) via a second fluid connector (242) from a second fluid column (244). Second fluid column (244) may be configured for, for example, providing a post-column additive. Post-column additives (PCAs) may be used to influence the electrospray ionization process in various ways, for example, to promote desolvation, change the charge state distribution, or other known ways, and they can be solvents or other chemical moieties. Second fluid column (244) may also be coupled with an electrically grounded bulkhead (226) to prevent stray electrical currents from traveling up the second fluid column (244).

As described, high voltage power supply (202) is coupled with multi-port fluid union (224) via an electrical lead (230) within nanoESI cartridge (222) that couples with electrical lead (214) through liquid junction (220). In some configurations, high voltage power supply (202) is coupled directly with an outer conductive surface of multi-port fluid union (224) to provide electrical current to multi-port fluid union (224) sufficient to ionize any fluids therein. Ionized fluids are thereafter emitted from multi-port fluid union (224) through a distal tip (232) of an electrospray needle (234). Ionized fluids may in some circumstances be emitted from electrospray needle (234) toward an atmospheric pressure inlet to the mass spectrometer that serves as a counter electrode (236). The electrospray current return is commonly formed by the electrically grounded counter electrode (236).

High voltage power supply (202) is coupled with the high voltage port (220) of the nanoESI cartridge (222) through a current sensing resistor (250). A wired connection defined by electrical lead (214) exists between the current sensing resistor (250) and the multi-port fluid union (224), thus biasing the multi-port fluid union (224) to the high voltage potential. Advantageously, the two fluid connection liquid junctions (216, 218) are similarly biased at the high voltage potential directly but are not part of the sensed current to the multi-port fluid union (224). In prior art configurations, only the multi-port fluid union (224) is coupled with the power supply (202)—the two fluid paths (208, 244) between the liquid junctions (216, 218) and the grounded bulkhead (226) are not—resulting in stray currents being measured by the high-side current measurement device. By biasing liquid junctions (216, 218), the two fluid paths (208, 244) remain at the same voltage potential as the multi-port fluid union (224), and thus, virtually zero electrical current flows between the multi-port fluid union (224) and the liquid junctions (216, 218). Leakage current is therefore allowed to flow through the two fluid paths (208, 244) between the liquid junctions (216, 218) and the grounded bulkhead (226). This high-side current sensing configuration and method allows stray, bias, and leakage currents to be ignored. More specifically, the bias, or leakage components illustrated consist of the bias current for the high voltage monitor (205) of the high voltage monitor output circuit (204), and the two leakage paths (208, 244) between the liquid junctions (216, 218) and the grounded bulkhead (226). Because they are not included in the sensed current, a direct measure of the spray current is achieved.

The voltage across each end (252, 254) of the current sensing resistor (250) is heavily attenuated via 1,000:1 precision voltage dividers (256, 258) to comply with typical data acquisition and computer voltage potentials. The resulting voltage is subtracted using a difference amplifier (260), and the difference obtained results in a direct proportional measure of the ESI spray current. As such, using this approach, improved or optimal resolution is achieved without an isolation amplifier.

Optionally, a controller circuit (270) may be coupled with the output (268) of current monitoring circuit (206), and optionally the output (205) of voltage monitoring circuit (204). Controller circuit (270) may be configured to receive the output current from output (268), or a digitized representation of output (268), and determine a state of the electrospray emitter based on the electrical current flow. Specifically, the state of the electrospray emitter includes a mode of operation indicative of an electrospray regime, such as one of the first regime (102), the second regime (104), or the third regime (106) as described above with regard to FIG. 1. Controller circuit (270) may thereafter include a user interface (272) configured to display or otherwise alert the operator of the determined electrospray regime, though in other embodiments controller circuit (270) may interface with an external user interface (272). Additionally, controller circuit (270) can determine a health of nanoESI cartridge (222), for example, by tracking and identifying changes in the output current with respect to the applied voltage over time. If the changes are significant (e.g., past a threshold limit), this can indicate nano ESI cartridge (222) should be replaced.

C. High-Side Current Sensing with Isolation

As described above, one difficulty with direct high-side measurement techniques is measuring current to nanoamp resolution in the presence of a very high common mode voltage (e.g., +/−8 kilovolts). Such a high common mode voltage must be heavily attenuated in order to protect the downstream electronics. Another solution to overcome these difficulties is by isolating, or electrically floating, the large common mode supply voltage and sense circuit to protect the downstream electronics. The measured quantity may be translated across the isolation barrier using modulation and demodulation techniques to the downstream electronics.

Figure 3:
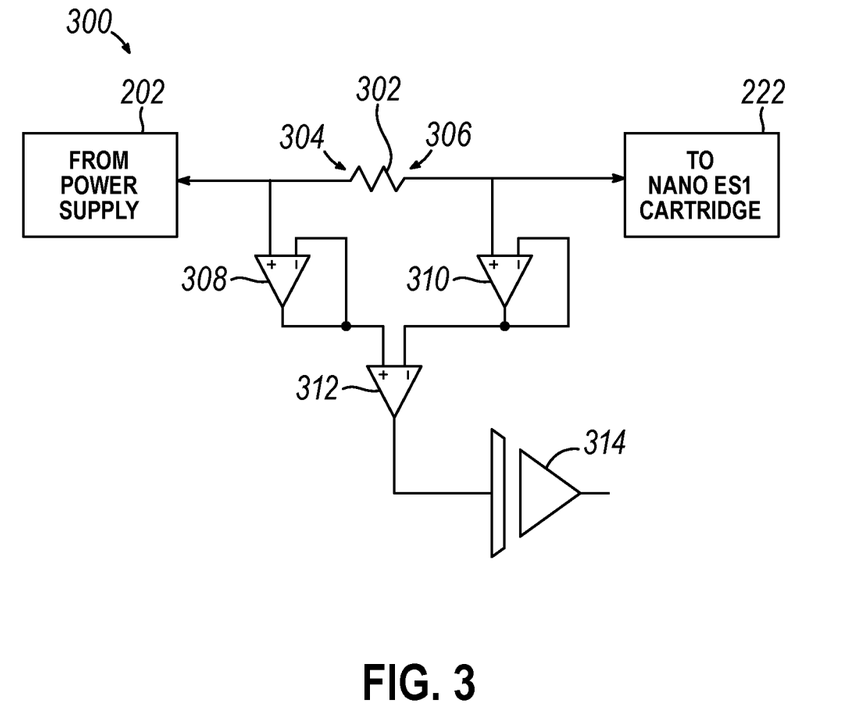
FIG. 3 depicts a schematic diagram of an alternative high-side current measurement circuit for inclusion into the first apparatus of FIG. 2, the alternative high-side current measurement circuit including an isolation amplifier.

To that end, depicted in FIG. 3 is an alternative current monitoring circuit, or isolation amplifier circuit (300), which may take the place of current monitoring circuit (206) of the first exemplary apparatus (200) described above. This solution is identical to the direct high side measurement approach described above with regard to the first exemplary apparatus (200) with the exception that an isolation amplifier circuit (300) is employed to electrically float the large input voltage. Isolation amplifier circuit (300) includes a current sensing resistor (302). Each end (304, 306) of current sensing resistor (302) is electrically coupled with a buffer (308, 310), followed by a difference amplifier (312) and isolation amplifier (314). This technique also requires an isolated power supply (202) (see, FIG. 2) for the floating amplifiers, as well as a means of modulation and demodulation across the isolation barrier (not shown). The modulation and demodulation may introduce systematic noise.

D. Low-Side Current Sensing

Figure 4:
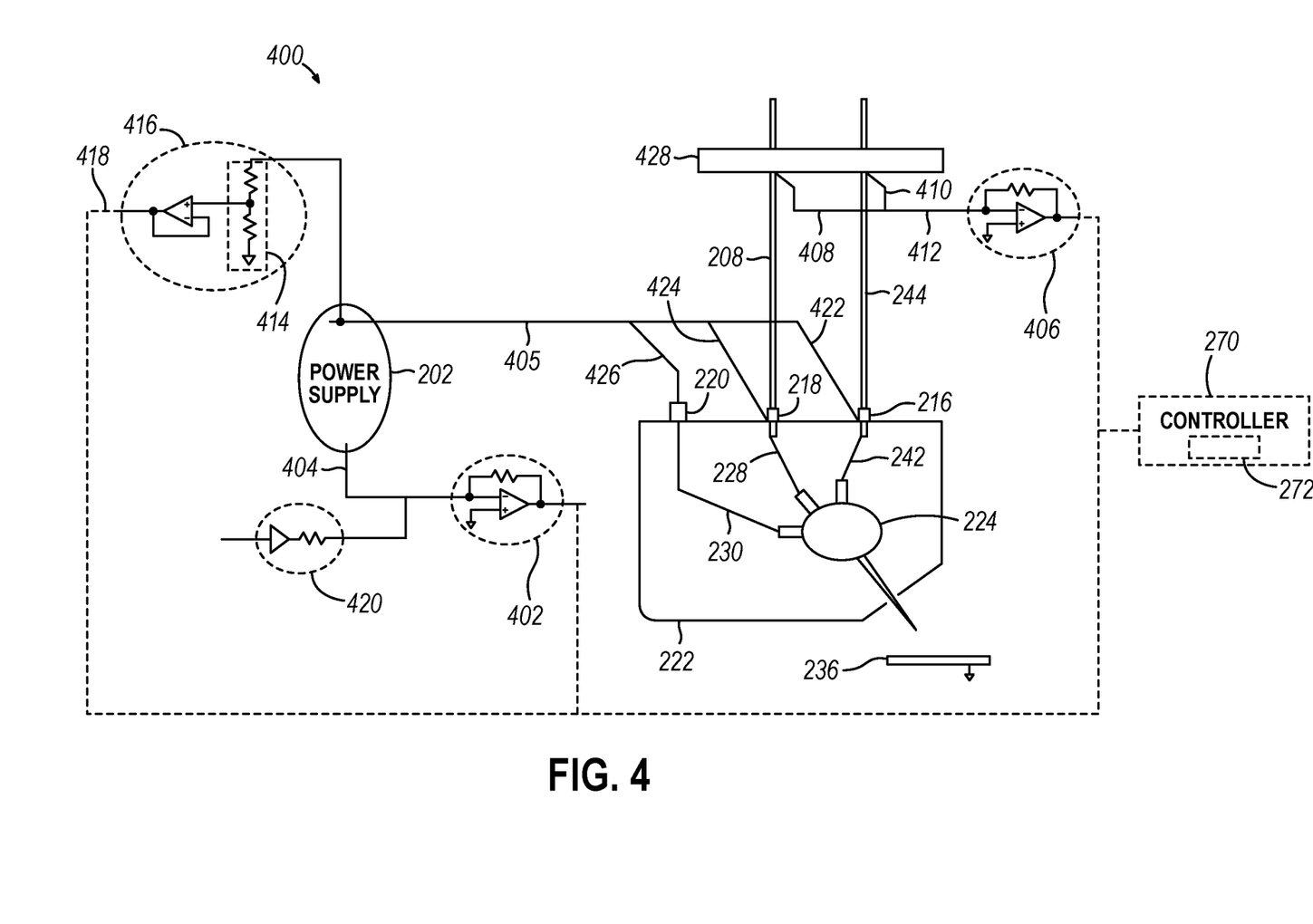
FIG. 4 depicts a schematic diagram of a second apparatus for electrospray ionization of a fluid sample, including an exemplary low-side current measurement circuit for directly measuring electrospray current.

Another solution to overcome the current measurement difficulties is by utilizing one or more low-side current sensing circuits. To that end, depicted in FIG. 4 is an alternative current monitoring circuit technique deployed in a second exemplary apparatus (400). As will be described, the low-side current sensing circuitry may take the place of current monitoring circuit (206) isolation amplifier circuit (300) of the first exemplary apparatus (200), while all other components, connections, functions, and configurations relating to the nanoESI cartridge (222), fluid paths (208, 244), liquid junctions (216, 218, 220), electrical lead (230), fluid connectors (228, 242), counter electrode (236), controller (270), and user interface (272) remain as described with regard to the first exemplary apparatus (200).

Using this technique, two low-side current sense circuits must be utilized; the first low-side circuit (402) is used to measure the total load current flowing through low-side electrical path (404) (and similarly the high-side electrical path (405)) of the power supply (202), and the second low-side circuit (406) is used to measure the total leakage current at path (412) defined by the summation of the two leakage currents at paths (408, 410) created by each of the two conductive fluid streams (208, 244, respectively). The first low-side circuit (402) is therefore configured to measure the total current supplied to each of liquid junctions (216, 218, 330) via electrical paths (422, 424, 426, respectively). The resulting ESI spray current is obtained by controller (270) by subtracting the leakage current from path (412) from the total current measured at path (404). To accurately perform the measurement of the total leakage current at path (412), bulkhead (428) may be configured at a virtual electrical ground.

In addition, some bias current may flow through the resistive divider (414) of voltage monitor circuit (416) for developing the output monitor voltage (418). To perform this voltage measurement via voltage monitor circuit (416), a current bias compensation circuit (420) may be utilized.

E. One Exemplary High-Side Current Sensing Circuit Configuration

As described above with regard to FIG. 2, one difficulty with direct high-side measurement techniques is measuring current to nanoamp resolution in the presence of a very high common mode voltage (e.g., +/−8 kilovolts). Such a high common mode voltage must be heavily attenuated in order to protect the downstream electronics. One particular solution to overcome these difficulties is to protect the downstream electronics without utilizing an isolation amplifier, as illustrated and described by current monitoring circuit (206). Various circuitry techniques are available to that end. Below is a detailed description of one exemplary technique for providing the operational functions of current monitoring circuit (206).

Figure 5:
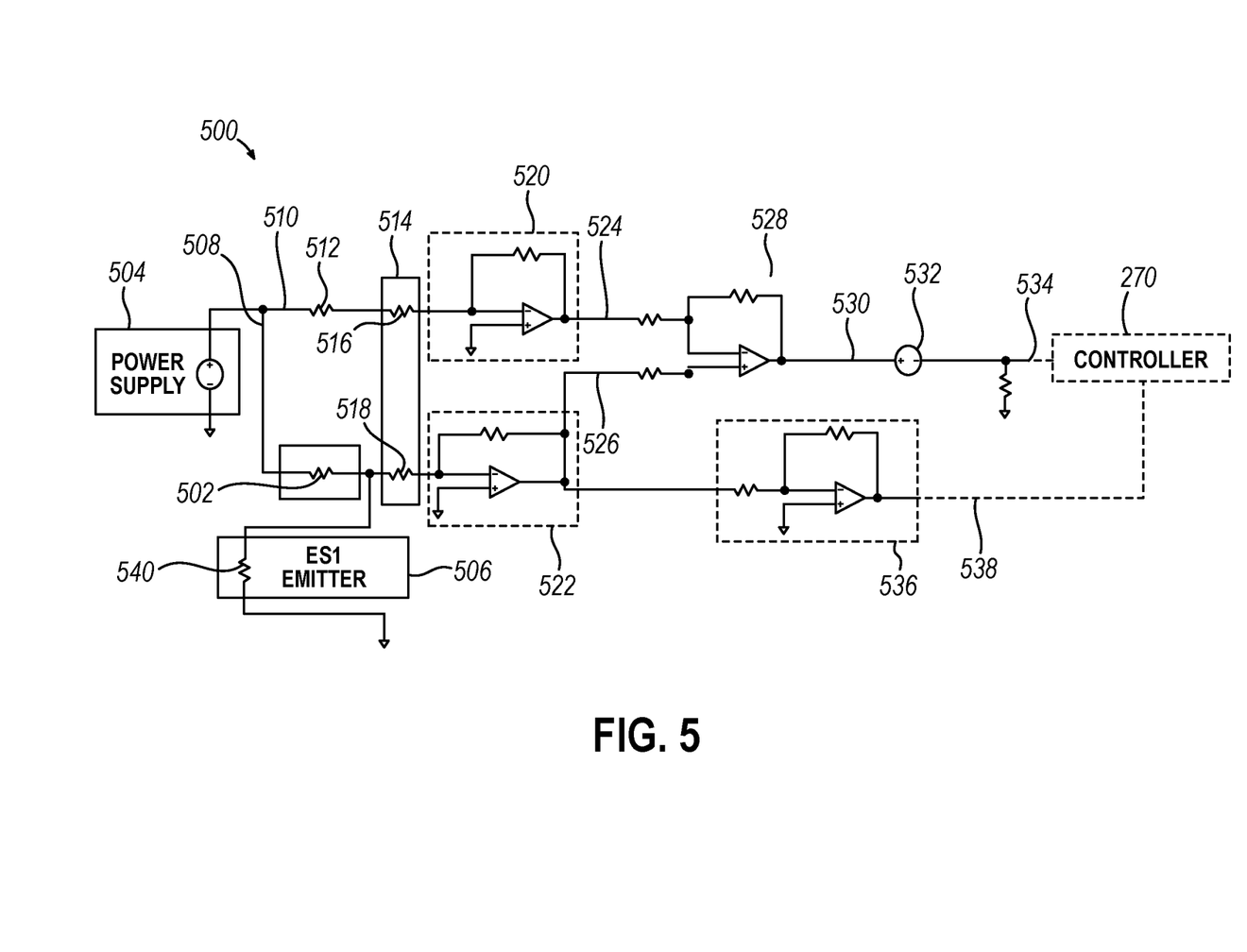
FIG. 5 depicts a schematic diagram of one exemplary high-side current sensing circuit configuration which may be utilized by the first apparatus of FIG. 2.

It should be understood that variations to circuit (500) may be configured based on the operational parameters. Circuit (500) is specifically configured, in one embodiment, to measure current of an electrospray apparatus performing under the following parameters: (a) absolute max, common mode voltage range being 0 volts to +/−8 kilovolts; (b) the nominal common mode voltage range being 0 volts to +/−6 kilovolts, with the ESI spray current range being 0 to 100 microamps at less than 12% linearity error, with the target range for normal operation being 0 to 1 microamps at less than 1% linearity error, and with the target range at 0 to 10 microamps at less than 2% linearity error; (c) the resolution over nominal common mode voltage range less than or equal to 10 nanoamps; and (d) the accuracy over nominal common mode voltage range less than or equal to 50 nanoamps.

Depicted in FIG. 5 is one exemplary current sensing circuit (500) which may be utilized to form current monitoring circuit (206) as shown in FIG. 2. Current sensing circuit (500) includes a current sensing resistor (502) disposed electrically between the power supply (504) and the ESI emitter (506). The primary objective of current sensing circuit (500) is to measure the voltage across current sensing resistor (502). To ensure an even current split between the current paths (508, 510), a matching resistor (512) to current sensing resistor (502) may be included. Current sensing resistor (502) and matching resistor (512) may be, for example, 10 megaohm resistors. Each current path thereafter includes a matched pair (514) of high voltage resistors (516, 518) for performing the primary high voltage resistance of the 1,000:1 precision voltage dividers (256, 258) (see FIG. 2). Each resistor (516, 518) of the matched pair of resistors (514) may be, for example, a 1 gigaohm resistor. High voltage resistors (516, 518) may further be configured to exhibit a ratio tolerance of less than or equal to 0.2%, and a voltage coefficient of resistance less than or equal to 0.1 ppm/volt.

Thereafter, each current path (508, 510) includes a matching transimpedance amplifier circuit (520, 522) for converting each current from high voltage resistors (516, 518) into a voltage. Transimpedance amplifier circuits (520, 522) may each be configured for, for example, 1/1,750 gain. Thereafter, each output voltage (524, 526) from transimpedance amplifier circuits (520, 522, respectively) is routed to a difference amplifier circuit (528), the output (530) being indicative of the voltage across current sensing resistor (502). An additional gain of nine-times may be included in the difference amplifier circuit (528) to follow the attenuating inverting transimpedance amplifier circuits (520, 522) to boost the difference signal into a range that is appropriate for the final output. That is because the high voltage power supply (504) may configured to output anywhere between 0 and +/−8,000 volts, and the attenuating transimpedance amplifier circuits (520, 522) may be used to reduce the common-mode voltage to a manageable level for the downstream electronics. Thereafter, the output (530) may be input into a software scale-correction module (532), and the final voltage output (534) may be routed to controller (270) for use as described herein.

Finally, circuit (500) may also include a voltage monitor circuit (536) to output a voltage (538) virtually indicative of the inverse of output (526) for measurement by controller (270). The transfer function of voltage monitor circuit may be, for example, 570 microvolts/high voltage (e.g., +8 kilovolts corresponds to +4.56 volts at output (538)).

As such, the ESI emitter as represented by electrospray needle (234) (see FIG. 2) is biased to the high voltage supply value of power supply (202) and adjusted by controller (270) or by an operator for optimal spray current, which is sensed by the current sense resistor (502). The ESI emitter resistance acts as the load represented by resistor (540). The spray current flows through the current sense resistor (502), followed by the matching pair (514) of load resistors (516, 518)) in series. The return for the emitted ESI spray is the grounded counter-electrode (236) (see FIG. 2). The circuit (500) is therefore advantageous as it is capable of accurately measuring a wide range of spray currents (e.g., from 0 to 100 microamps. The dynamic range of circuit (500) is an advantageously 10,000:1.

Figure 6:
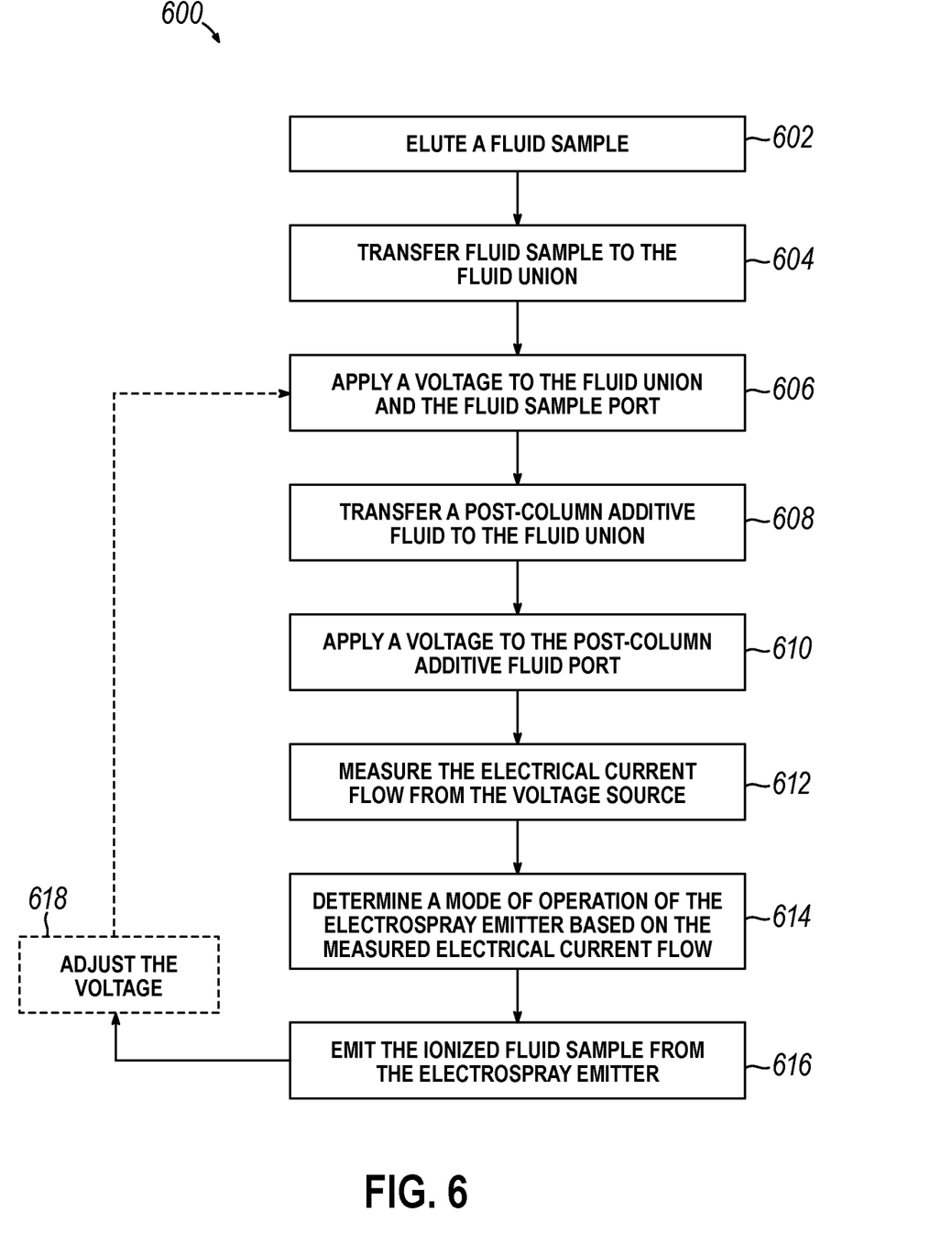
FIG. 6 depicts a flowchart of one exemplary method of ionizing a fluid sample using an electrospray ionization system.

Depicted in FIG. 6 is a flowchart of one exemplary method (600) of ionizing a fluid sample using an electrospray ionization system, such as by using either apparatus (200, 400). It should be understood that method (600) may additionally be utilized by any other electrospray ionization apparatus, such as an LC apparatus, which communicates a fluid sample from a column to a fluid union. When utilizing method (600) with an LC apparatus, at step (602) the fluid sample is eluted in the column and, at step (604), transferred to the fluid union. In some embodiments, the fluid union may include one or more ports for receiving fluids into the fluid union. As such, a first port may be configured to receive the eluted fluid sample. Thereafter, at step (606), a voltage may be applied to the fluid union and the first port to ionize the fluid sample within the fluid union. Particularly, the voltage may be applied both at the fluid union and at the first port, the voltages being balanced to restrict current leakage from the fluid union via the first port. In some embodiments, fluid union may optionally include a second port for receiving a PCA fluid therethrough. In such embodiments, at step (608), the PCA fluid may be transferred to the fluid union through the second port, and at step (610), the voltage may also be applied to the second port to similarly restrict current leakage from the fluid union via the second port. By restricting current leakage toward the LC column and the PCA source, the electrical current applied to the fluid union and therefore to the fluid sample within the fluid union may be accurately measured without measurement errors associated with stray current leakage away from the fluid union.

Next, at step (612), the electrical current flowing between the power source and the at least one of the fluid union, the first port, or the optional second port may be measured. In some embodiments, a current sensing circuit may be included on the electrical path between the power source and the fluid union, first port, or second port. In some embodiments, the current sensing circuit includes a current sensing resistor. At step (614), a controller circuit communicatively coupled with the current sensing circuit may be configured to determine a mode of operation of the electrospray emitter based on the measured electrical current flow. For example, the controller circuit may be configured to analyze the measured current to determine whether the emitter is operating in a first regime, where the electrospray emitter is not spraying or is dripping, a second regime, where the electrospray emitter is spraying a stable spindle, or a third regime, where the electrospray emitter is spraying a cone jet. At step (616), the emitter is configured to emit the fluid sample from the electrospray emitter based on the characteristics of the fluid sample and the applied current. In some embodiments, at step (618), the controller circuit may optionally be configured to automatically adjust the power source to vary the output voltage based on the measured electrical current or determined mode of operation to thereby vary the mode of operation.

Many of the embodiments described herein are in the context of a replaceable ESI cartridge (e.g., nano ESI cartridge (222) in FIG. 2). However, the techniques described herein can also be implemented in other systems that do not include the cartridge. For example, merely an ESI emitter might be replaced rather than an entire cartridge with the respective chromatography components embedded within.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus for electrospray ionization of a fluid sample, comprising:
   a fluid union;
   a fluid column coupled with a first port and configured to receive a fluid sample and separate molecules in the fluid sample to produce a separated fluid sample, wherein the fluid column is configured to transfer the separated fluid sample into the fluid union via the first port;
   a power source coupled with the fluid union and configured to apply a voltage potential to the fluid union sufficient to ionize the fluid sample to form an ionized fluid sample, wherein the power source is further coupled with the first port and configured to apply the voltage potential to the first port to restrict current leakage from the fluid union;
   an electrospray emitter coupled with the fluid union, wherein the electrospray emitter is configured to emit the ionized fluid sample; and
   a current sensing circuit disposed between the power source and the fluid union, wherein the current sensing circuit is configured to determine an electrical current flow between the power source and the fluid union.

2. The apparatus of claim 1, further comprising:
a fluid reservoir coupled with a second port, wherein the fluid reservoir is operable to transfer a post-column additive fluid into the fluid union via the second port;
wherein the power source is coupled with the second port and configured to apply the voltage potential to the second port to restrict current leakage from the second port toward the fluid reservoir.

3. The apparatus of claim 1, wherein the current sensing circuit includes a current sensing resistor.

4. The apparatus of claim 3, wherein the current sensing resistor defines first and second opposing leads, wherein each of the first and second opposing leads is coupled with a voltage divider.

5. The apparatus of claim 3, wherein the current sensing resistor defines first and second opposing leads, wherein each of the first and second opposing leads is coupled with a differential amplifier.

6. The apparatus of claim 3, wherein the current sensing resistor defines first and second opposing leads, wherein each of the first and second opposing leads is coupled with first and second attenuating inverting amplifiers operable to convert the voltage potential to a lesser voltage.

7. The apparatus of claim 6, wherein the first and second attenuating inverting amplifiers are matched with respect to gain.

8. The apparatus of claim 1, wherein the fluid union is formed of an electrically conductive material.

9. The apparatus of claim 1, further comprising a controller circuit configured to determine a state of the electrospray emitter based on the relationship between applied voltage and electrical current flow, wherein the state of the electrospray emitter includes a mode of operation indicative of an electrospray regime.

10. The apparatus of claim 9, wherein the electrospray regime includes at least one of a first regime, a second regime, or a third regime;
wherein in the first regime the electrospray emitter is not spraying or is dripping;
wherein in the second regime the electrospray emitter is spraying a stable spindle; and
wherein in the third regime the electrospray emitter is spraying a cone jet.

11. The apparatus of claim 1, wherein the fluid column is electrically coupled with a ground source, wherein the ground source is operated at or near an electrical ground potential.

12. A method of electrospray ionization of a fluid sample, wherein an electrospray assembly includes a fluid union, a fluid column coupled with a first port, a power source coupled with the fluid union and the first port and configured to apply a voltage to the fluid union sufficient to ionize the fluid sample to form an ionized fluid sample, an electrospray emitter coupled with the fluid union, and a current sensing circuit disposed between the power source and the fluid union, the method comprising:
separating molecules in the fluid sample using the fluid column to produce a separated fluid sample;
transferring the separated fluid sample into the fluid union via the first port,
applying the voltage to the fluid union and to the first port, the voltage at the fluid union and first port being balanced to restrict current leakage from the fluid union;
via the current sensing circuit, measuring an electrical current flow between the power source and the fluid union.

13. The method of claim 12, further comprising:
emitting the ionized fluid sample from the electrospray emitter.

14. The method of claim 12, further comprising:
determining a mode of operation of the electrospray emitter based on the measurement of the electrical current flow between the power source and the the fluid union.

15. The method of claim 14, wherein the mode of operation includes at least one of a first regime, a second regime, or a third regime;
wherein in the first regime the electrospray emitter is not spraying or is dripping;
wherein in the second regime the electrospray emitter is spraying a first electrospray plume, wherein the first electrospray plume includes a spindle; and
wherein in the third regime the electrospray emitter is spraying a second electrospray plume, wherein the second electrospray plume includes a cone jet.

16. The method of claim 12, further comprising:
transferring a post-column additive fluid into the fluid union via a second port; and
applying the voltage to the second port, the voltage at the fluid union, the first port, and the second port being balanced to restrict current leakage from the fluid union.

17. The method of claim 12, wherein the current sensing circuit includes a current sensing resistor.

18. The method of claim 12, wherein transferring the separated fluid sample further comprises
eluting the separated fluid sample from the fluid column to the fluid union via the first port, wherein the fluid column is configured for liquid chromatography.

19. An apparatus for electrospray ionization of a fluid sample, wherein the apparatus includes a fluid union, a fluid column coupled with a first port, and an electrospray emitter coupled with the fluid union, wherein the fluid column is configured to separate molecules in the fluid sample to produce a separated fluid sample and to transfer the separated fluid sample into the fluid union via the first port, the apparatus comprising:
a power source configured to apply a voltage potential to the fluid union sufficient to ionize the fluid sample to form an ionized fluid sample, wherein the power source is further configured to apply the voltage potential to the first port to restrict current leakage from the fluid union;
a current sensing circuit configured to determine an electrical current flow between the power source and the fluid union; and
a controller configured to determine an electrospray operation regime based on the electrical current flow.

20. The apparatus of claim 1, further comprising:
a cartridge that houses the fluid union, the first port being an input port to the cartridge, and
wherein the fluid union receives the separated fluid sample from the first port at a fluid port of the fluid union via a first fluid connector.

* * * * *